(12) United States Patent  (10) Patent No.: US 7,629,694 B2
Mouttet  (45) Date of Patent: Dec. 8, 2009

(54) INTERCONNECTIONS FOR CROSSWIRE ARRAYS

(76) Inventor: Blaise Laurent Mouttet, 6380 Michael Robert Dr., Springfield, VA (US) 22150

( * ) Notice: Subject to any disclaimer, the term of this patent is extended or adjusted under 35 U.S.C. 154(b) by 603 days.

(21) Appl. No.: 11/465,101

(22) Filed: Aug. 16, 2006

(65) Prior Publication Data

US 2008/0042299 A1 Feb. 21, 2008

(51) Int. Cl.
*H01L 23/52* (2006.01)
(52) U.S. Cl. .................. 257/776; 257/777; 257/778; 257/E23.143; 257/E23.17
(58) Field of Classification Search .............. 257/758, 257/776–778, E23.143, E23.17
See application file for complete search history.

(56) References Cited

U.S. PATENT DOCUMENTS

| | | | |
|---|---|---|---|
| 3,777,221 A | * | 12/1973 | Tatusko et al. .............. 361/761 |
| 5,412,641 A | | 5/1995 | Shinjo et al. |
| 5,555,422 A | | 9/1996 | Nakano |
| 6,128,214 A | | 10/2000 | Kuekes et al. |
| 6,293,655 B1 | | 9/2001 | Imanaka et al. |
| 7,062,848 B2 | | 6/2006 | Pan et al. |
| 7,067,328 B2 | | 6/2006 | DuBrow et al. |
| 2006/0240681 A1 | | 10/2006 | Williams et al. |

* cited by examiner

*Primary Examiner*—Matthew E Warren

(57) ABSTRACT

A system includes a first crosswire array, having first input wiring and first output wiring, and a second crosswire array, having second input wiring and second output wiring, wherein the first crosswire array and second crosswire array are provided on or above the same side of a first substrate. A second substrate is provided opposing the first substrate and including interconnection tips and circuit elements used to electrically connect the first output wiring to the second input wiring. This system may be applied for interconnection between crosswire or crossbar arrays with different functionalities such as memory storage, pattern analysis, electron beam lithography, image sensing, image generation, etc. It may also provide for interconnection between solid state electronics, fabricated on the second substrate and nanowire or nanotube based crosswire arrays fabricated on the first substrate.

20 Claims, 12 Drawing Sheets

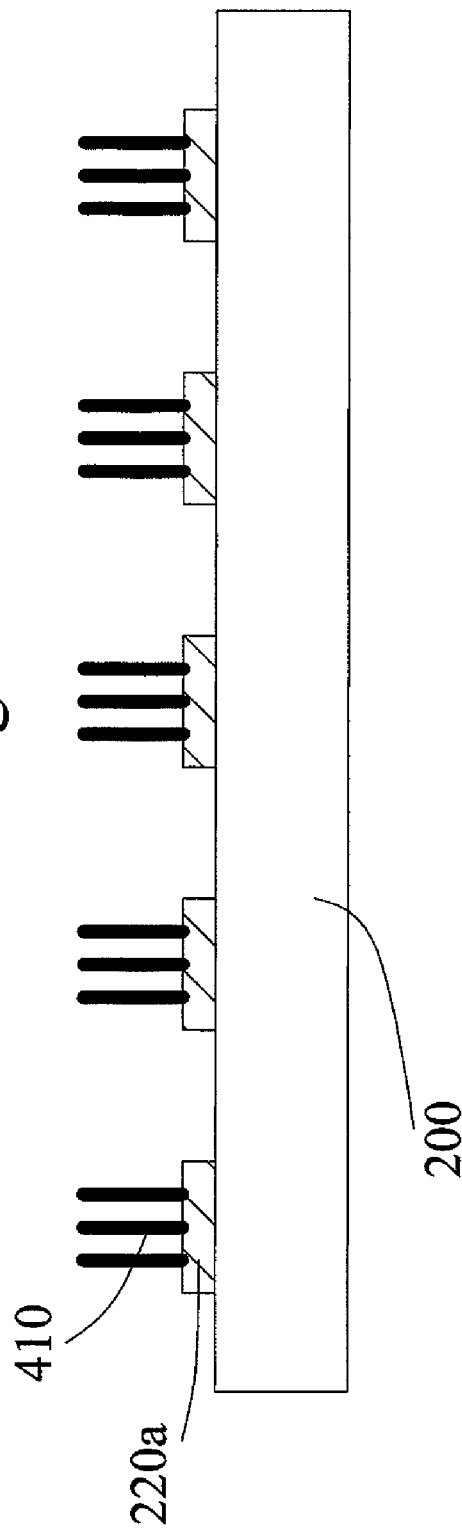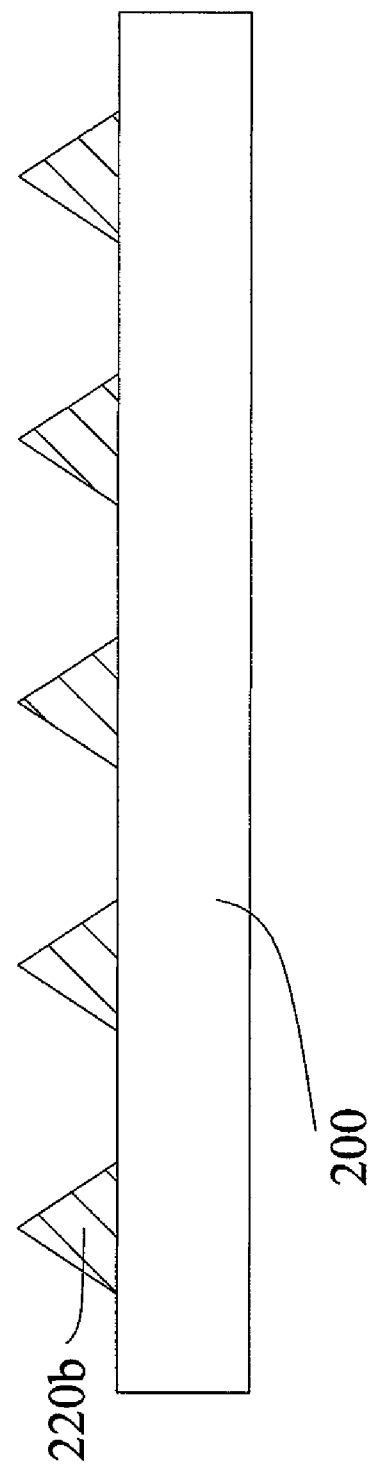

INTERCONNECTIONS FOR CROSSWIRE ARRAYS

CROSS-REFERENCE TO RELATED APPLICATIONS

This application is related to the following co-pending patent applications, which are incorporated by reference in their entirety:

U.S. patent application Ser. No. 11/395,232 entitled "Crossbar Arithmetic Processor," filed Apr. 3, 2006, U.S. patent application Ser. No. 11/395,237 entitled "Programmable Crossbar Signal Processor," filed Apr. 3, 2006, U.S. patent application Ser. No. 11/418,057 entitled "Digital Parallel Electron Beam Lithography Stamp," filed May 5, 2006, U.S. patent application Ser. No. 11/446,223 entitled "Crosswire Sensor," filed Jun. 5, 2006, and U.S. patent application Ser. No. 11/446,236 entitled "Crosswire Radiation Emitter," filed Jun. 5, 2006.

FIELD OF THE INVENTION

The present invention pertains to an electrical interconnection systems for crosswire or crossbar structures and to nanoelectronics.

BACKGROUND OF THE INVENTION

Crosswire arrays have been developed in recent years with a primary focus in applications in information storage and retrieval. One type of crosswire array comprises a first set of conductive parallel wires and a second set of conductive parallel wires formed so as to intersect the first set of conductive wires. The intersections between the two sets of wires are separated by a thin film material or molecular component. A property of the material, such as the material's resistance, may be altered by controlling the voltages applied between individual wires from the first and second set of wires. Alteration of the materials resistance at an intersection may be performed so as to achieve a high resistance or low resistance state and thus store digital data. It is noted that crosswire arrays are occasionally referred to as crosspoint or crossbar arrays and these terms are used synonymously throughout this patent application.

Nagasubramanian et al. U.S. Pat. No. 5,272,359 discloses such a crossbar array employing an organic conducting polymer as the material. Resistance variation from $10^{12}$ ohms to $10^7$ ohms is reported to be achieved by applying a 10V pulse with a 100 ms duration. Nagasubramanian et al. discusses the uses of the crossbar array as forming a memory matrix for an artificial neural net.

Other materials useful for electrically programmable resistance are those with a perovskite structure such as magnetoresistive materials (U.S. Pat. Nos. 6,531,371 and 6,693,821), a variety of organic semiconductors (U.S. Pat. Nos. 6,746,971 and 6,960,783), and silver-selenide/chalcogenide laminate films (U.S. Pat. No. 6,867,996).

Kuekes et al. U.S. Pat. No. 6,128,214 uses crossbars applicable at nanometer scales by employing molecular components as a bridging component between the wires. Such nanoscale crossbars have been disclosed as useful tools in molecular electronics capable of performing a variety of tasks including signal routing, multiplexing, and performing simple logic functions in U.S. Pat. Nos. 6,256,767, 6,314,019, 6,518,156, 6,586,965, 6,812,117, 6,854,092, 6,858,162, 6,870,394, 6,880,146, 6,898,098, 6,900,479, 6,919,740, 6,963,077, 7,073,157, and U.S. Patent Application 2005/0258872. Molecular crossbar arrays used in neural networks is disclosed in U.S. Patent Application 2004/0150010. Manufacturing of molecular crossbar arrays is taught in U.S. Pat. Nos. 6,248,674, 6,432,740, 6,835,575, 6,846,682, and 6,998,333.

Examples of non-patent literature concerned with molecular crossbar arrays include Ziegler et al. "A Case for CMOS/nano Co-design," Lee et al. "CMOL Crossnets as Pattern Classifiers," and Das et al. "Architectures and Simulations for Nanoprocessor Systems Integrated On the Molecular Scale." Reinhold Koch provides a discussion of programmable crossbar arrays formed from ferroelectric material in Scientific American Vol. 293, No. 2 pgs. 56-63.

Examples of other crosswire array architectures that use direct mechanical connection using nanotubes rather than variable resistance films are found in Segal et al. U.S. Pat. No. 6,919,592 and Lieber et al. U.S. Pat. No. 6,781,166 as well as numerous other issued and pending patents assigned to Nantero.

Additional teachings regarding new applications of crosswire architectures may be found in the copending applications mentioned in the cross-reference to related applications section above. These patent applications collectively provide teachings of a variety of configurations for crosswire arrays applicable to reconfigurable electronics, pattern analysis, waveform analysis and shaping, communications, control systems, arithmetic processing units, electron beam lithography, electron microscopy, radiation and visual sensors, radiation and light generators, visual displays, and other applications.

For a variety of these applications it would be useful to have a compact electrical interconnection mechanism to transmit signals between different crosswire arrays that are provided for different purposes. Also, in the case that the crosswire array is provided at nanometer scales, it would be useful to have an electrical interface system between the nanoscale wires of the crosswire array and microscale wires of MOSFET or other more conventional electronic components.

SUMMARY OF THE INVENTION

Different fabrication techniques and conditions (temperature, pressure, etc.) are usually applied to forming crosswire array structures made from nanostructured or molecular materials as opposed to MOSFET solid state circuits made from silicon wafers. However, many applications of crosswire arrays as discussed in co-pending U.S. patent applications Ser. Nos. 11/395,232, 11/395,237, 11/418,057, 11/446,223, and 11/446,236 require both crosswire arrays and solid state circuits. The present invention provides the advantage of isolating the solid state circuitry based on silicon processed wafers from the crosswire circuitry based on nanostructured or molecular materials by providing these components on different substrates.

In the most basic embodiment the invention includes a first crosswire array including first input wiring and first output wiring, a second crosswire array including second input wiring and second output wiring, wherein the first crosswire array and second crosswire array are provided on or above the same side of a first substrate, and a second substrate opposing the first substrate and including interconnection tips used to electrically connect the first output wiring to the second input wiring.

BRIEF DESCRIPTION OF THE DRAWINGS

FIG. 4a illustrates one embodiment of interconnection tips formed on the second substrate.

FIG. 4b illustrates an alternative embodiment of the interconnection tips.

DETAILED DESCRIPTION

Figure 1:
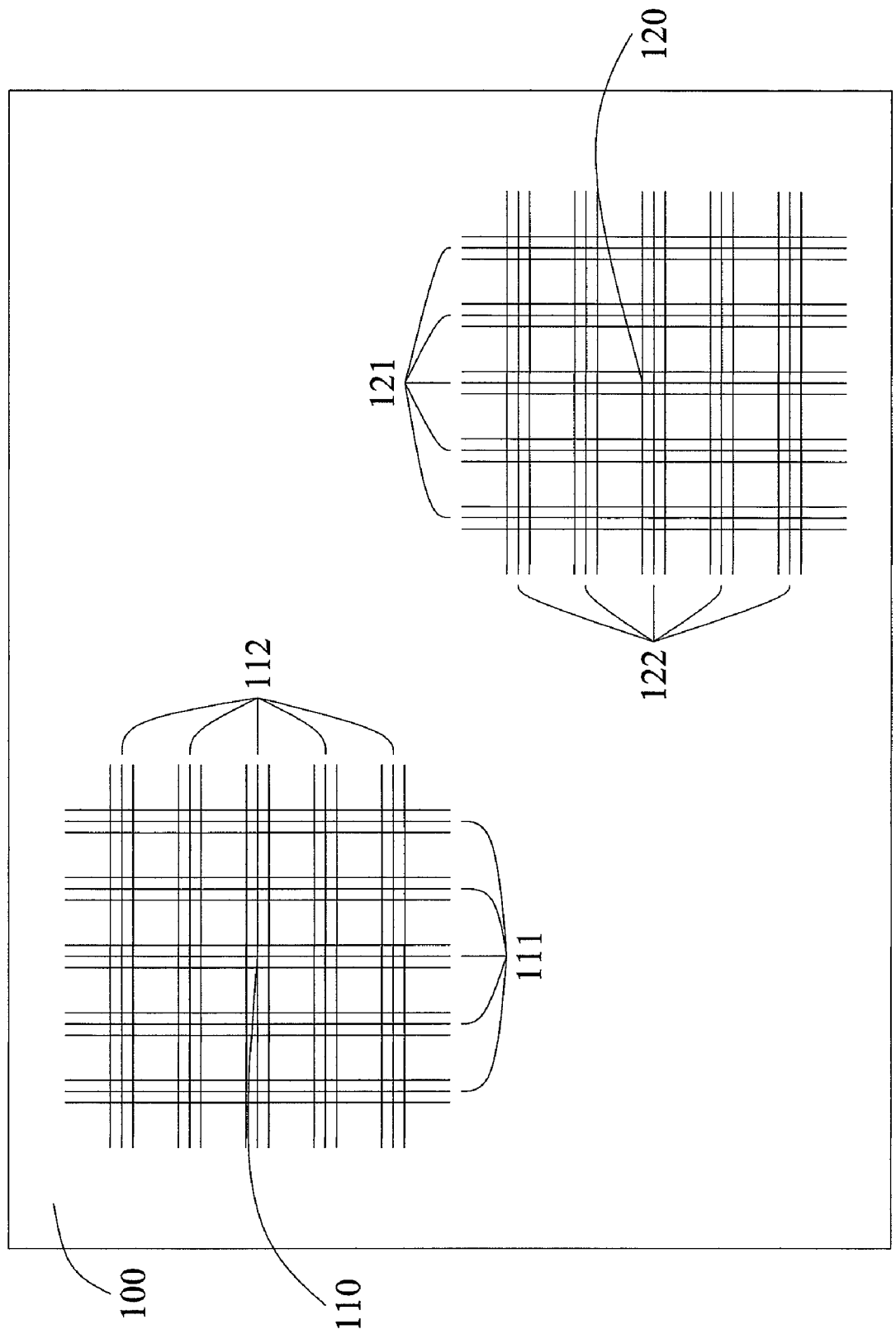
FIG. 1 illustrates two crosswire arrays formed on a substrate.

FIG. 1 illustrates two crosswire arrays 110, 120 formed on a substrate 100. The crosswire arrays 110, 120 may be fabricated by first forming input wiring 111, 121, such as p-doped wiring, using an appropriate lithography process as known to the prior art. Preferably, other techniques such as microimprint or nanoimprint lithography, inkjet printing, or silkscreen printing may be used in forming the doped wiring pattern which may be applied with less constrained environmental conditions than silicon manufacturing processes. U.S. Pat. Nos. 7,062,848 and 7,067,328 provide some examples of using printing techniques in patterning doped nanostructured materials. Conjugated polymers and doped nanoparticles contained in a conductive binder are examples of the material that may be used as the "ink" if these processes are employed. A subsequent functional film such as a molecular film, a polymer film, or a nanocomposite material may be coated above the input wiring. The material used for the functional film should be chosen dependent upon the function desired for the different crosswire arrays. For example, one crosswire array may be chosen to be a reconfigurable electronic circuit, in which case programmable resistive material may be used for a programmable signal processor as discussed in co-pending patent application Ser. No. 11/395,237. However, if crosswire array is desired to be a radiation emitter, an electroluminescent film may be used as in co-pending patent application Ser. No. 11/446,236. Film materials may be selectively coated on the particular crosswire arrays using processes such as imprinting, silkscreening, or inkjet printing. Output wiring 112, 122, such as n-doped wiring, may be formed above the film material using microimprinting, nanoimprinting, inkjet printing, silkscreen printing, or other lithography approach as performed for the input wiring 111, 121 but at a perpendicular, or at least an intersecting, angle. Numerous alternative techniques and structures for forming crosswire or crossbar arrays, as detailed in the references noted in the Background of the Invention section and in the co-pending applications noted in the Cross-reference to Related Applications, may also be used.

The benefit of forming input wiring 111 and 121 as p-doped wiring and output wiring 112 and 122 as n-doped wiring is that this generates an intrinsic rectification that avoids unwanted signal feedback in the crosswire structure. See FIG. 7 and the related description of Kuekes et al. U.S. Pat. No. 6,128,214 for further details of this effect.

As illustrated in FIG. 1, the input wiring 111, 121 and output wiring 112, 122 are grouped into units of three adjacent wires. In the case of using nanoscale wiring this provides the advantage of redundancy when some of the wires are broken or not sufficiently conductive. If microscale wiring is used for the crosswire this grouping may not be necessary. However, a set of nanoscale parallel wires formed with a sufficiently small diameter may be more conducive to ballistic electron transport and thus more effective than a microwire of the same width than the collective set of nanowires leading to higher mobility and switching speeds.

Figure 2:
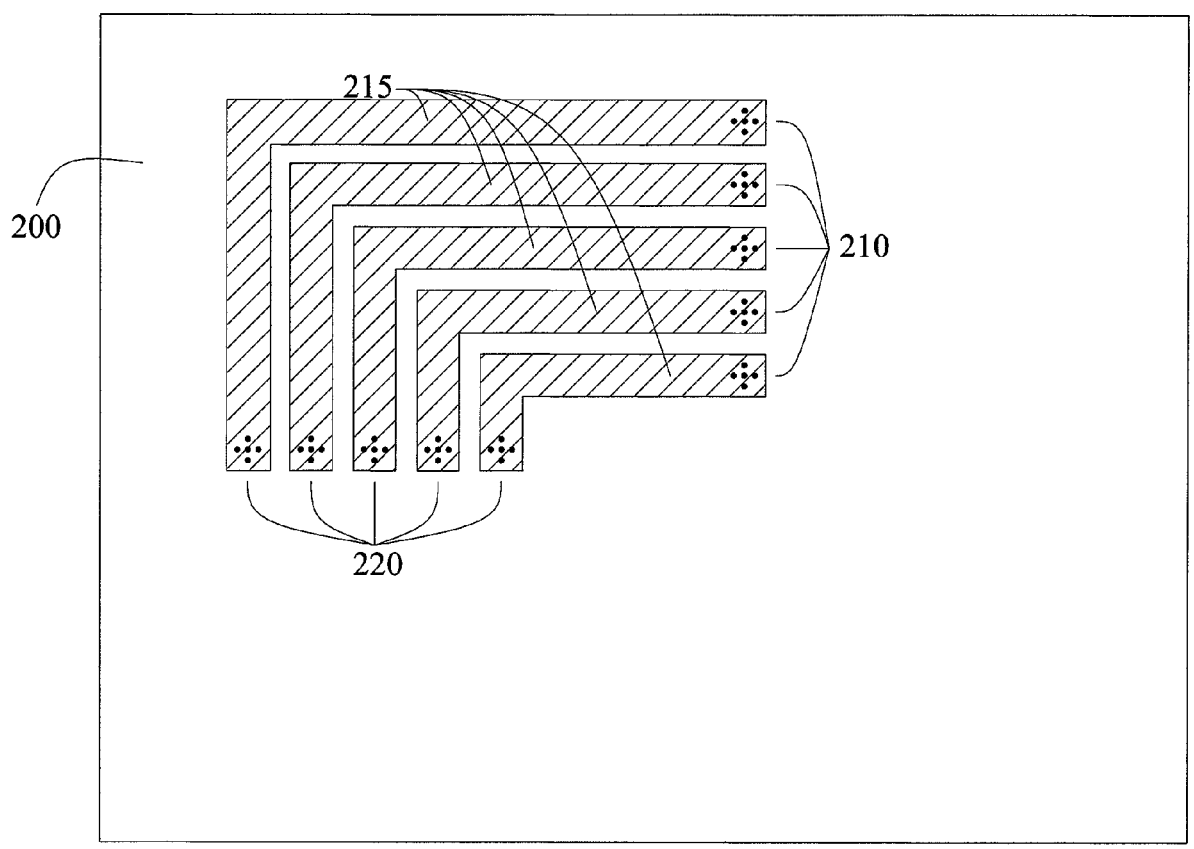
FIG. 2 illustrates a second substrate including input connections, output connections, and interconnection wiring lithographically patterned on the second substrate.

FIG. 2 illustrates a second substrate 200 including input connections 210, output connections 220, and interconnection wiring 215 lithographically patterned on substrate 200. The interconnection wiring 215 serves as circuit elements to connect the input and output connections 210, 220. Processing techniques common in integrated circuit fabrication such as chemical or physical vapor deposition, doping, sputtering, resist coating, optical lithography, and etching may be used in processing substrate 200.

Figure 3:
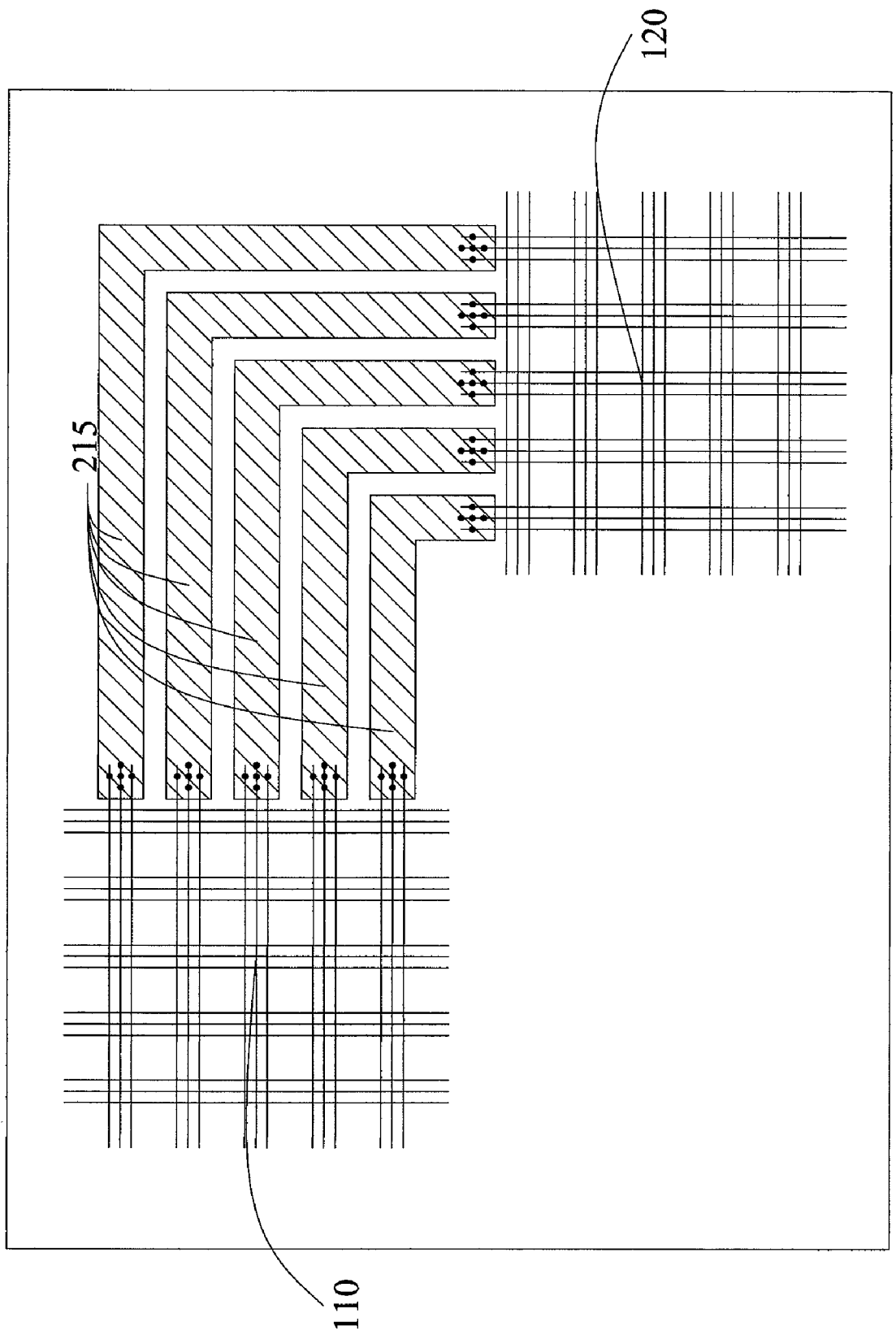
FIG. 3 illustrates the functional cross-section of the substrate of FIG. 1 aligned and mated with the substrate of FIG. 2.

FIG. 3 illustrates the functional cross-section of substrate 100 aligned and mated with substrate 200. Appropriate alignment mechanisms and alignment calibration techniques as known in the semiconductor processing and packaging arts may be employed in the alignment and bonding of substrate 100 and 200. Imanaka et al. U.S. Pat. No. 6,293,655 describes an analogous (but distinct) system using different electronic components on opposing substrates which are mated together for the purpose of creating a unified inkjet printhead control system.

FIGS. 4a and 4b illustrate cross-sectional views of two different embodiments of substrate 200 with output connections 220. Similar embodiments may be provided for input connections 210.

In FIG. 4a, an array of vertical nanowires, nanotubes, carbon fibers, or other electrically conductive fibers (referred to collectively as interconnection tips 410) extends from output connections 220a and may be fabricated by various prior art techniques including selective catalytic particle placement and growth. Various useful teachings related to the fabrication of vertical nanotube arrays used in field emission displays are found in the prior art and in many cases would be obvious for a person of ordinary skill in nanofabrication to apply to the present invention. Multiwall carbon nanotubes or carbon nanofibers are preferable as the tips 410 for their electrical conductivity and mechanical resiliency. Based on experimental results known to the prior art array, densities of $10^6$-$10^{10}$ nanotubes/cm² are achievable for vertical nanotube arrays. This range of densities may be applied to form output connections 220a (or the corresponding input connections 210) and given an area of 100 square microns, dozens, hundreds, or thousands of tips 410 may be formed per connection 220a depending on the array density.

FIG. 4b illustrates an alternative embodiment in which, instead of using multiple wire, fiber, or tube shaped tips, connection 220 is etched from a metallic or doped semiconductor material to form a conical or faceted interconnection tip 220b. Fabrication of such etched tips is known from manufacturing techniques of tips for scanning probe microscopes. The usefulness of this embodiment will be explained further in view of FIG. 8.

Figure 5:
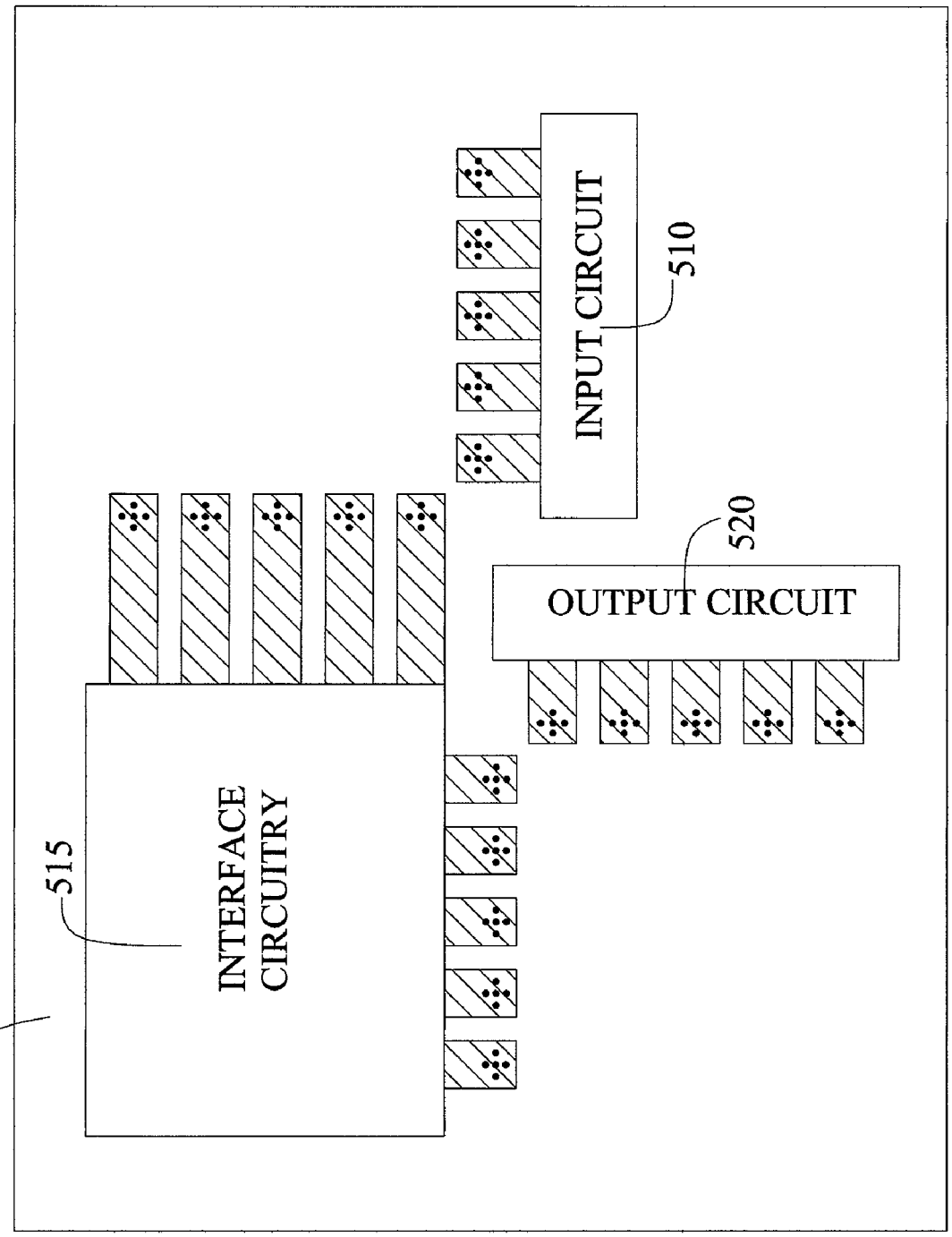
FIG. 5 illustrates an alternative embodiment of the second substrate that includes an input circuit, interface circuit, and output circuit.
Figure 6:
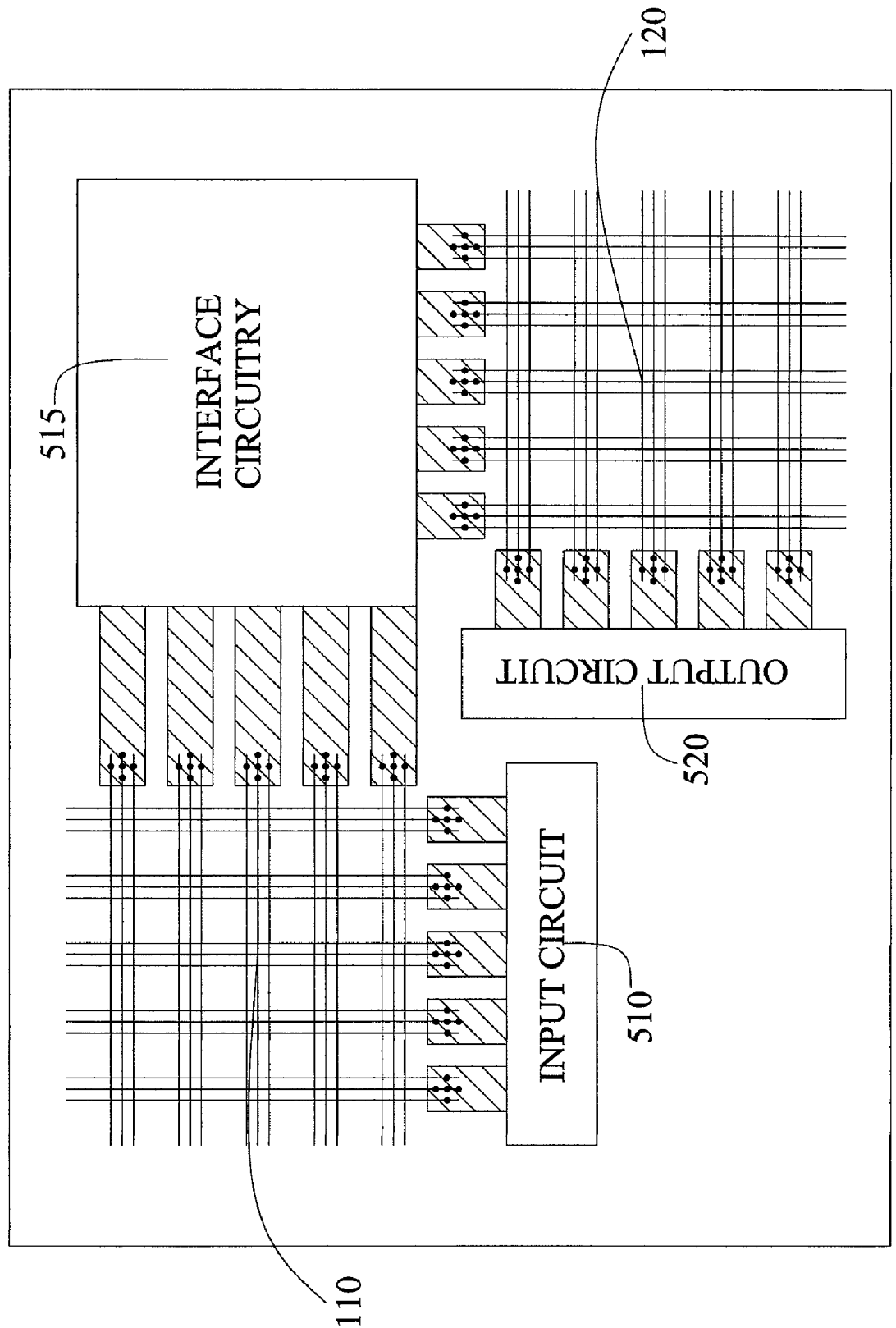
FIG. 6 illustrates the functional cross-section of the substrate of FIG. 1 aligned and mated with the substrate of FIG. 5.

While the embodiment of FIGS. 1-3 provides for electrical connection and integration between different crosswire arrays, many applications of crosswire arrays may require the use of solid-state circuitry used as addressing, interfacing, or processing circuits. Numerous examples of combinations of solid-state circuits with crosswire arrays are found in co-pending U.S. patent applications Ser. Nos. 11/395,232, 11/395,237, 11/418,057, 11/446,223, and 11/446,236. FIG. 5 illustrates an example of a substrate 500 that includes an input circuit 510, interface circuitry 515, and an output circuit 520. FIG. 6 illustrates the functional cross-section of substrate 100 of FIG. 1 aligned and mated with substrate 500. Input circuit 510 may include a column selection circuit for crosswire array 110 while output circuit 520 may include a row selection circuit for crosswire array 120. Several types of circuits which may be formed using the construction of the present invention are described by the following examples.

EXAMPLES

1. Data Transfer

In the case that both crosswire arrays are used as binary data storage arrays, as in various of the prior art patents described in the Background of the Invention section, the construction of FIG. 6 may be used to select a column of crosswire array 110 via input circuit 510 and select a row of crosswire array 120 via output circuit 520. In this case interface circuitry 515 may include amplifiers leading from the rows of crosswire array 110 to the columns of crosswire array 120. This arrangement may be used to transfer the data from a particular column of crosswire array 110 to a particular row of crosswire array 120. Sequentially transferring of each set of the column data of crosswire array 110 to the row data of crosswire array 120 may be performed by including clocked shift registers or other appropriate circuitry in input circuit 510 and output circuit 520. Assuming that the data of crosswire array 120 was initially at a high resistance (logic 0) state, the cumulative result of such a data transfer would be a duplication of the bit data of crosswire array 110 into crosswire 120 except with a 90 degree rotation.

2. Arithmetic Processor

As described in copending patent application Ser. No. 11/395,232 (incorporated by reference in its entirety) numerous crosswire arrays are cascaded to achieve an arithmetic result. For example, FIG. 12 of the Ser. No. 11/395,232 application illustrates three crossbar (synonym to crosswire) arrays and eight solid state circuit elements including a program circuit, 2 interface circuits, a post-processing circuit, an input unit, and 3 ground selector circuits. Using the present invention the three crosswire circuits may be formed on a first substrate and the eight solid state circuits may be formed on a second substrate. The different substrates can be separately manufactured using techniques appropriate for the different circuit types.

3. Signal Processing and Pattern Comparison

In co-pending patent application Ser. No. 11/395,237 (incorporated by reference in its entirety), several embodiments of crossbar (synonym to crosswire) architectures are given for signal processing and pattern comparison. For example, FIG. 1 of the Ser. No. 11/395,237 patent application illustrates a signal processing crossbar array connected to an input selector circuit and an output selector circuit. Binary data may be input to the crossbar array via a data register of the input program circuit to program the crossbar state. This data register may be in the form of a second crossbar array designed for data storage and retrieval. Using the principles of the present invention the two crossbar arrays (one for data storage and one for signal processing) may be connected to the selector circuits and other circuit components. Thus crossbar circuits which may be formed by molecular film or bottom-up nanofabrication can be formed on one substrate while the selection circuitry may be formed by traditional top-down silicon wafer based processing technologies on another substrate.

As described in FIGS. 20-24 of the Ser. No. 11/395,237 patent application, pattern recognition and analysis may also be achieved by comparing data stored in a data register to data stored in a crossbar array. Using the techniques of the present invention combined with the techniques of the Ser. No. 11/395,237 application, the data register used for comparison may also be a crossbar array and comparison of data stored in multiple different crossbar arrays formed on a common substrate may be achieved.

4. E-Beam Applications

In co-pending patent application Ser. No. 11/418,057 (incorporated by reference in its entirety), several embodiments of crossbar (synonym to crosswire) architectures are given for e-beam lithography. In this application the crossbar addressing is used for selecting nanotips, such as multiwall carbon nanotubes, for field emission. The selection occurs using addressing circuitry as discussed in relation to FIGS. 5a, 5b, 6a, and 6b of patent application Ser. No. 11/418,057. The data used to determine the selection is explained to be stored in a ROM or similar memory. However, a crossbar memory architecture may alternatively be used as the data source instead of a ROM. This allows the electron emission crossbar and the memory crossbar to be formed on a common substrate using at least some common processing steps. In this case the opposing substrate that contains the interfacing circuitry between the data storage crossbar and the electron emission crossbar should have an aperture etched through the portion opposing the electron emission crossbar to allow electrons to be transmitted to a target. Alternatively, if the electron emission crossbar is used for an electron microscopy application the opposing substrate may include solid state sensor devices and microfluidic delivery channels to deliver a target material to be detected.

5. Pattern Generation

In co-pending patent application Ser. No. 11/446,236 (incorporated by reference in its entirety), several embodiments of architectures are given for crosswire radiation emitters useful in forming electronic visual displays. The pattern used to generate the crosswire visual display in the Ser. No. 11/446,236 patent application may be stored in a ROM, PROM, EEPROM, or similar memory device. However, using a crosswire memory to store the binary data used for the display allows for the memory to be formed on a common substrate with the radiation emissive crosswire array using at least some common processing steps during fabrication. The solid state interfacing circuitry may be formed on an opposing substrate with the interconnection tips. In one example, in order to transmit the visual information generated by the crosswire array the substrate (such as glass or polymeric film) on which the crosswire arrays are formed should be transparent to the emitted light. In an alternative example, the substrate of the crosswire array may be opaque (or reflective) while an aperture is etched in the substrate that the solid state interfacing circuitry is formed. The position of the aperture should correspond to the region of the crosswire radiation emitter. As another embodiment, both the substrate on which the crosswire arrays are formed may be transparent and an aperture may be formed on the substrate containing the interfacing circuitry in a position opposing the radiation emissive crosswire array to facilitate two sided radiation from the emissive crosswire array.

6. Image Sensing

In co-pending patent application Ser. No. 11/446,223 (incorporated by reference in its entirety), several embodiments architectures are given for crosswire sensors useful in pattern recognition and imaging sensing. A bit pattern generated based on output from the crosswire sensor in the Ser. No. 11/446,223 patent application may be stored in a ROM, PROM, EEPROM, or a similar memory device. However, using a crosswire memory to store the received binary data allows for the memory to be formed on a common substrate with the sensing crosswire array using at least some common processing steps during fabrication. The solid state interfacing circuitry may be formed on an opposing substrate with the interconnection tips. In one example, in order to receive visual information the substrate (such as glass or polymeric film) on which the crosswire arrays are formed should be transparent. In an alternative example, the substrate of the crosswire array may be opaque (or reflective) while an aperture is etched in the substrate that the solid state interfacing circuitry is formed. The position of the aperture should correspond to the region of the crosswire sensor. As another embodiment, both the substrate on which the crosswire arrays are formed may be transparent and an aperture may be etched on the substrate containing the interfacing circuitry in a position opposing the crosswire sensor array to facilitate two sided detection from the crosswire sensor.

MODIFICATIONS/ALTERNATIVES

Figure 7:
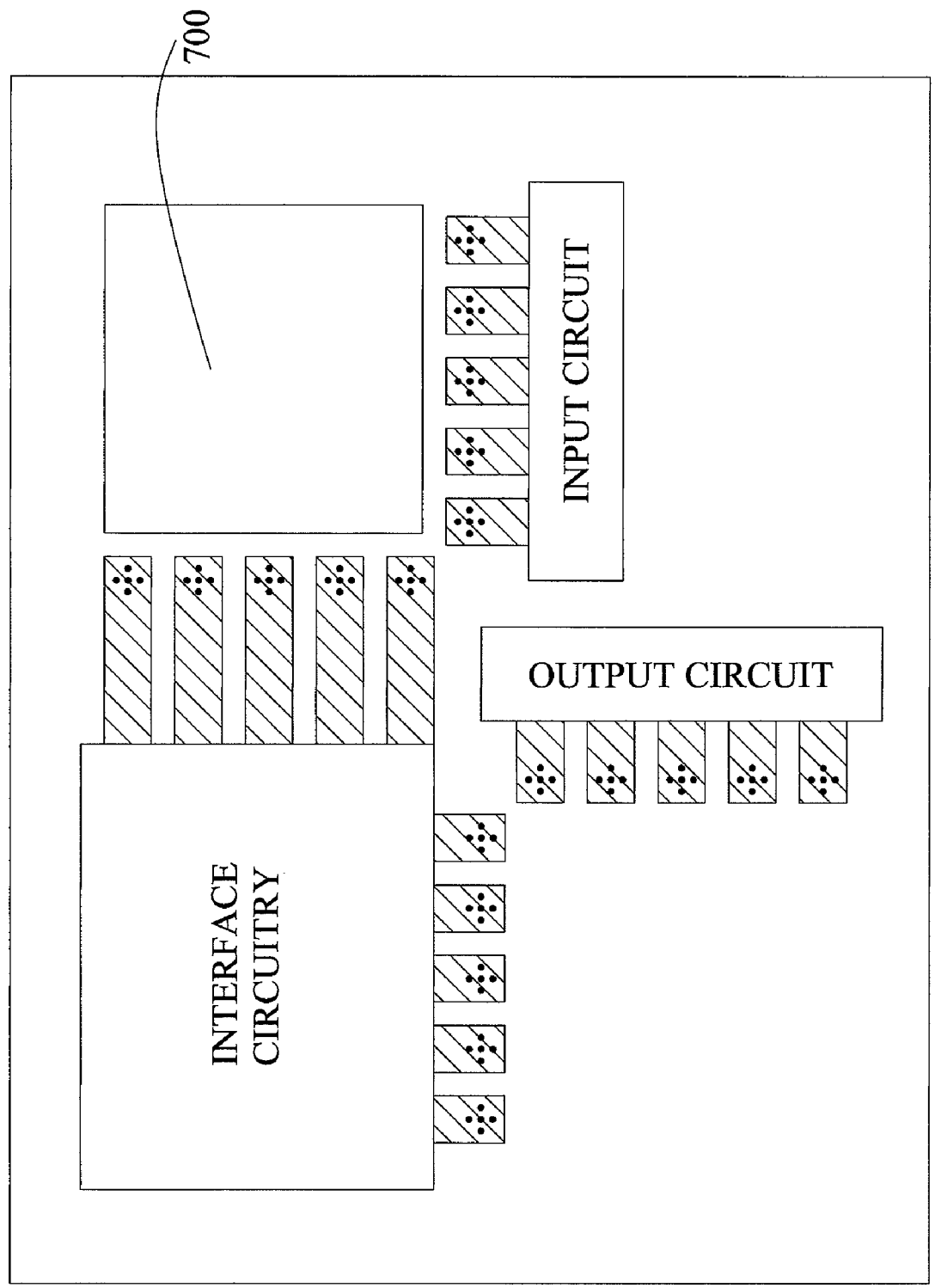
FIG. 7 illustrates an alternative embodiment of the substrate of FIG. 5 that includes an aperture.

In several of the above examples it was mentioned that the substrate containing the interface circuitry includes an etched aperture. FIG. 7 illustrates the substrate of FIG. 5 including an aperture in a position opposed to a crosswire array. The illustrated configuration would be suitable for a crosswire sensor array that would be opposed to the aperture 700. In the case of a crosswire light or electron emission element the positions of the input circuit and output circuit would be reversed.

Figure 8:
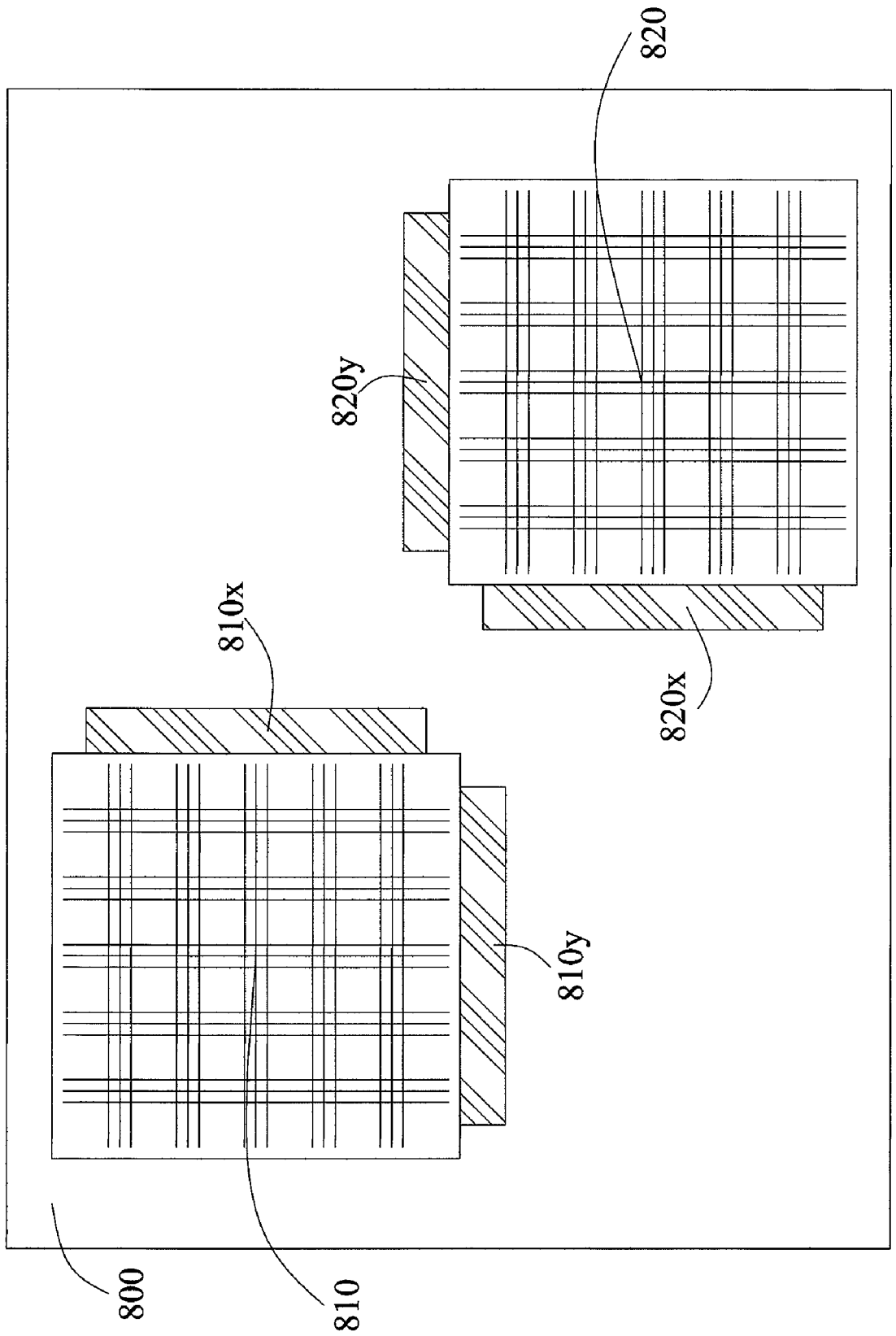
FIG. 8 illustrates an embodiment of the substrate of FIG. 1 including positioning mechanisms for the crosswire arrays.

FIG. 8 illustrates an embodiment of a substrate 800 including crosswire arrays 810, 820 and piezoelectric or microelectromechanical scanning elements 810x, 810y and 820x, 820y used to control the relative x and y positions of the crosswire arrays relative to the interconnection tips. FIG. 7 of Shindo et al. U.S. Pat. No. 5,412,641 illustrates an example of positioning elements for repositioning a substrate which may be usable in combination with the present invention. The tapered interconnection tips as shown in FIG. 4b of the present patent application allow for selective addressing as the crosswire arrays are scanned and relative movement occurs between the tips and the input or output wiring. This may be used in conjunction with selection circuitry to program or transfer data between crosswire arrays and provides for transfer between microscale and nanoscale addressing when the wiring of the crosswire arrays is formed from nanowires. A z-positioner may also be provided to allow for isolation between the substrate of the crosswire circuits and the opposing substrate by creating a sufficient gap separation between the substrates beyond the range of the interconnection tips. This may serve as a current cutoff mechanism to save energy or as a mechanism for quick shutdowns. The use of the described positioning system may also be advantageously applied to morphware type electronics in which the interconnection structure between circuit elements is changed to achieve different functions.

Figure 9:
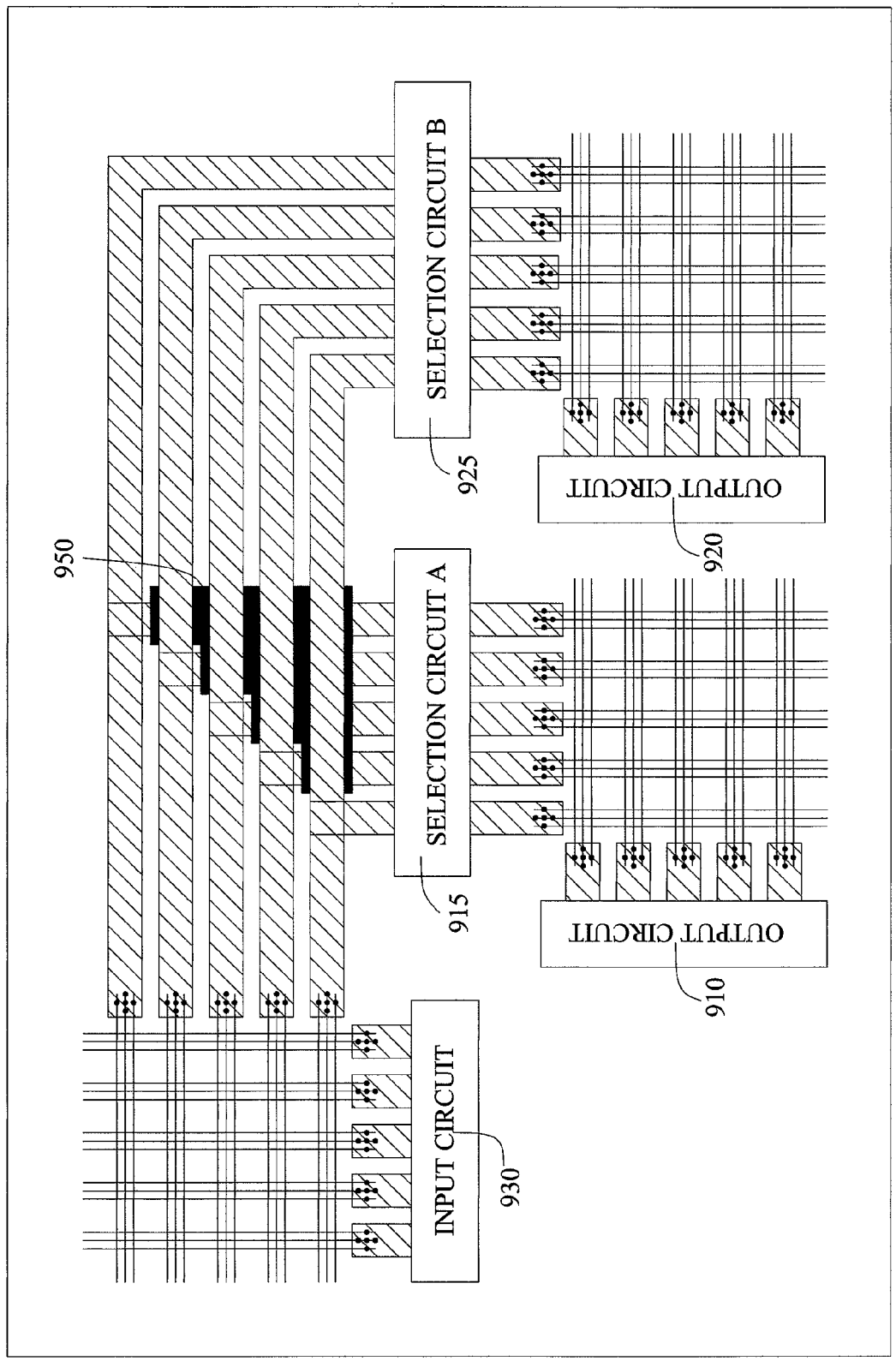
FIG. 9 illustrates the functional cross-section of an alternative embodiment of mated substrates that includes one input crosswire array and two output crosswire arrays.

Previous embodiments have illustrated only two crosswire arrays formed on a substrate, however the present invention is not so limited. FIG. 9 illustrates an embodiment (useable in combination with any of the previously discussed examples) in which an input circuit 930 may be used to transfer data from an input crosswire array to a selected one of a second or third crosswire array connected to output circuits 910,920 via selection circuits 915 and 925. Insulating film 950 may be patterned to isolate wirings directed to the different selection circuits. As an example of using this particular architecture, the input crosswire array may be formed for pattern sensing and the output crosswire arrays may be used for data storage. The selection circuits 915, 925 may be condition responsive so as to depend upon various factors such as user input, time, etc. so as to capture different images under different conditions and store these different images in the different crosswire arrays. This configuration may be advantageously extended to include >3 crosswire arrays so as to store many different images captured under different conditions or times in different output crosswire arrays.

Figure 10:
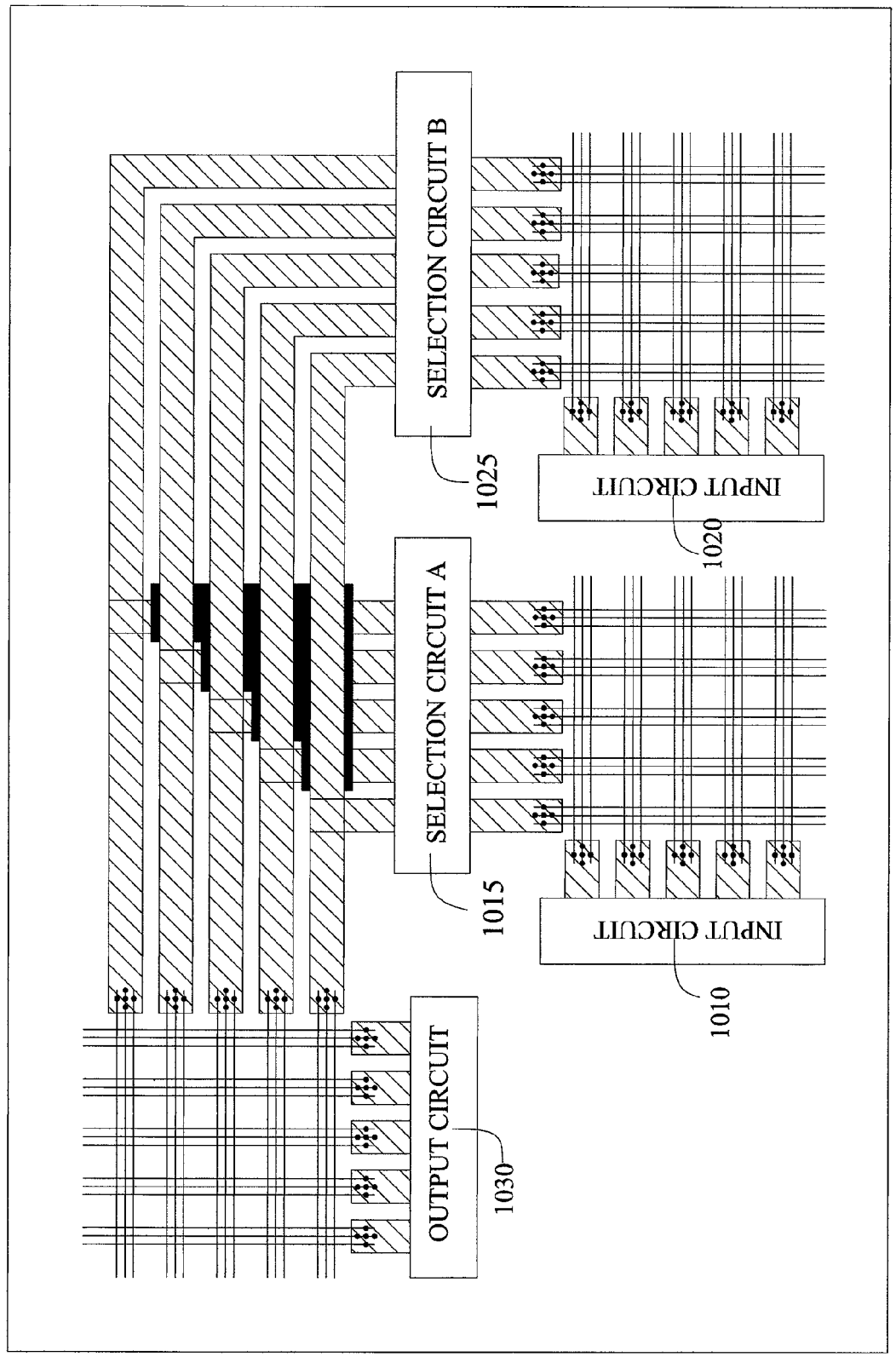
FIG. 10 illustrates the functional cross-section of an alternative embodiment of mated substrates that includes two input crosswire arrays and one output crosswire arrays.

FIG. 10 illustrates an embodiment (useable in combination with any of the previously discussed examples) in which an output circuit 1030 connected to an output crosswire array may be used to receive data from one of a second or third crosswire array connected to input circuits 1010,1020 via selection circuits 1015 and 1025. As an example of using this particular architecture, the input crosswire arrays may be formed for data storage and may each store separate patterns while the output crosswire array may be formed for image generation. Selection circuit A or B may be actuated based on user selection or other parameters such as time of day, etc. and the data stored in one of the input crosswire arrays may be transferred to the image generating crosswire array according to the particular condition. This configuration may be advantageously extended to include >3 crosswire arrays so as to display many different images stored in different crosswire data storage elements.

Figure 11:
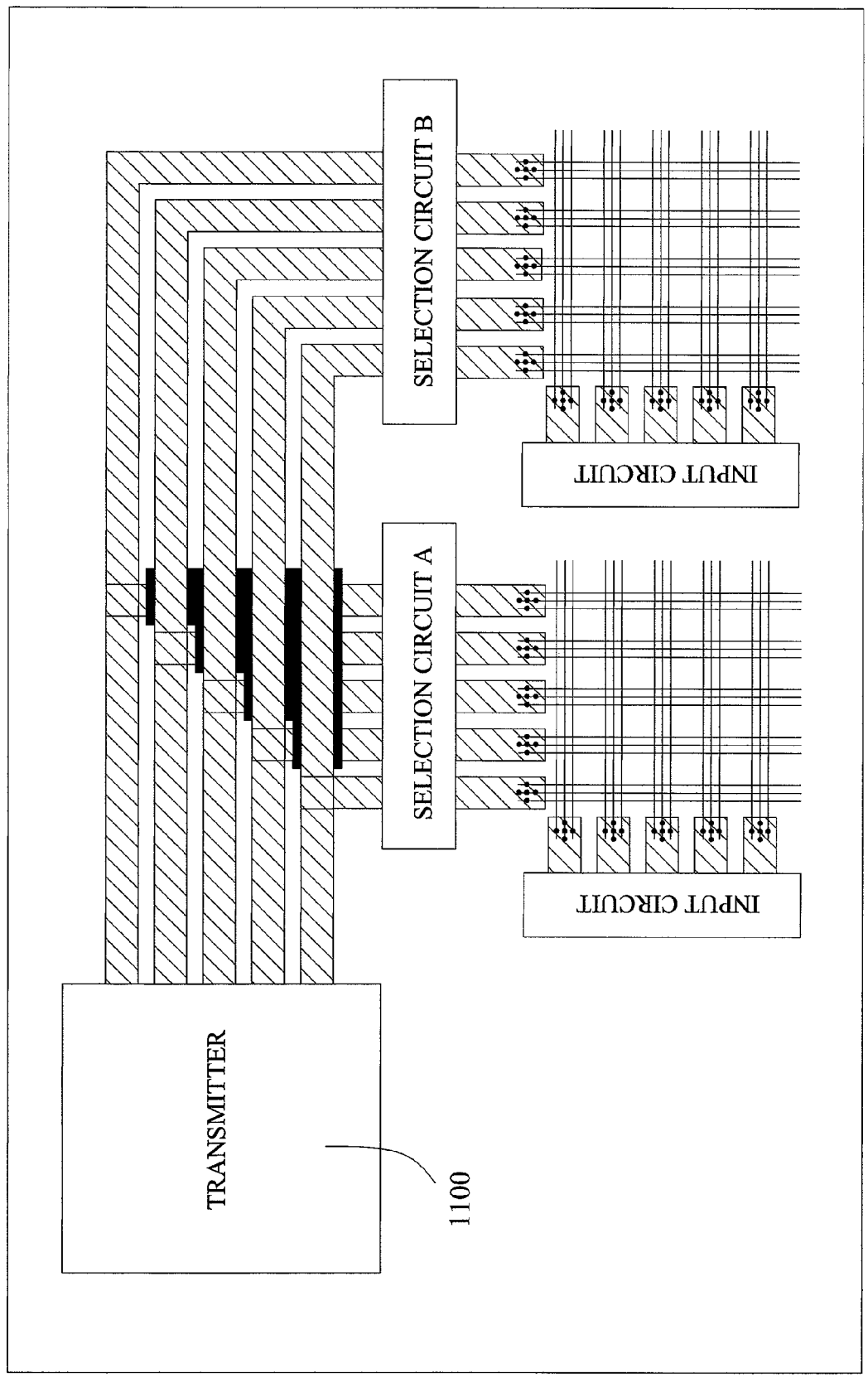
FIG. 11 illustrates the functional cross-section of an alternative embodiment of mated substrates that includes two input crosswire arrays and a transmitter circuit.
Figure 12:
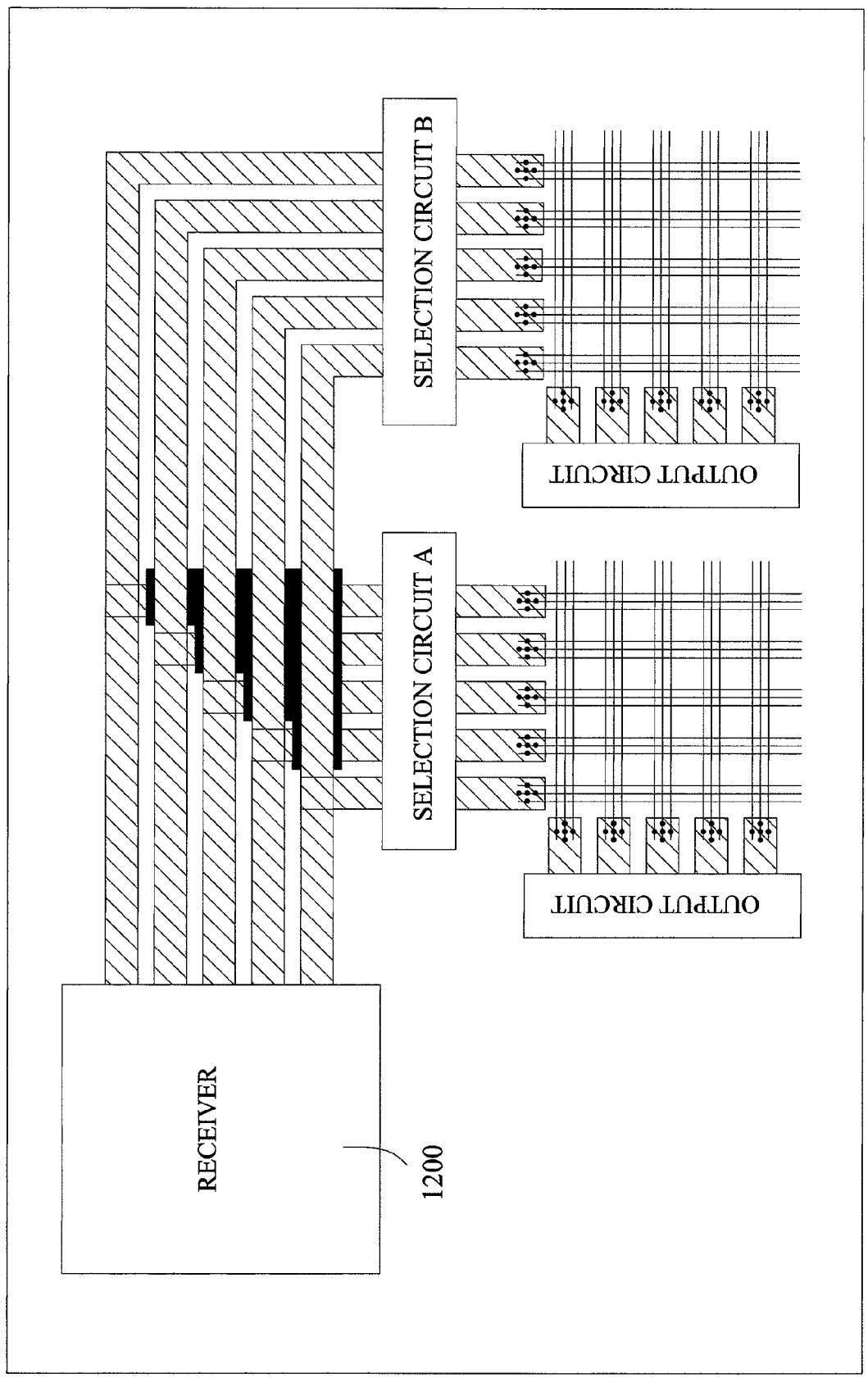
FIG. 12 illustrates the functional cross-section of an alternative embodiment of mated substrates that includes two output crosswire arrays and a receiver circuit.

In yet another embodiment, a wireless transmitter 1100 such as an RF or infrared transmitter may be used to transmit the data from a selected crosswire array (FIG. 11). A wireless receiver 1200 such as an RF or infrared receiver may be used to receive the data and transmitted the data to a selected output crosswire array (FIG. 12).

In a preferred embodiment substrate 100, containing the crosswire arrays, is processed using printing or imprinting fabrication and is formed from a non-silicon alternative material such as a transparent glass plate or a flexible polymer sheet while substrate 200, containing the interconnection tips and circuit elements, is formed from silicon and is processed using silicon-based techniques used in conventional IC fabrication such as chemical or physical vapor deposition, doping, sputtering, resist coating, optical lithography, and etching. However, in some cases both substrate 100 and 200 may be formed from silicon using common processing techniques to facilitate bonding and reduce effects of thermal stress.

The crosswire arrays were shown in the illustrated examples as arrays including 25 addressable elements in a 5×5 arrangement and with each addressable column and row formed by 3 wires. However, a variety of different configurations are possible and larger arrays (10×10, 100×100, etc.) are obviously advantageous to achieve storage of larger quantities of data whereas simpler applications may more economically benefit from smaller arrays (2×2, 3×3, etc.) Also asymmetric arrays (3×8, 7×15, etc.) may be useful in applications such as arithmetic crossbars. Increasing the number of wires per addressable column or row to be greater than three (5, 50, etc.) has the advantage of increasing reliability in case of a broken wire, however the addressable columns and rows may also be formed with only one or two wires in cases that the wires are of micrometer rather than nanometer diameters.

The current invention may be modified in many different ways and persons of ordinary skill in semiconductor processing and packaging, nanoelectronics, reconfigurable electronics, pattern analysis, waveform analysis and shaping, communications, control systems, arithmetic processing units, electron beam lithography, electron microscopy, radiation and visual sensors, radiation and light generators, visual displays, and any other field pertinent to this or any of the other patents or patent applications referred to in this application would obviously recognize that many useful prior art teachings in any one of these fields could usefully be applied to the current invention. The current invention is only limited by the following claims.

I claim:

1. A system comprising:
    a first crosswire array including first input wiring and first output wiring;
    a second crosswire array including second input wiring and second output wiring, wherein the first crosswire array and second crosswire array are provided on or above the same side of a first substrate; and
    a second substrate opposing the first substrate and including interconnection tips and circuit elements used to electrically connect the first crosswire array and the second crosswire array,
    wherein at least one of the first crosswire array and second crosswire array include a thin film with a programmable resistance.

2. The system of claim 1, wherein the first crosswire array is configured for data storage and retrieval.

3. The system of claim 2, wherein the second crosswire array is configured for pattern analysis.

4. The system of claim 2, wherein the second crosswire array is configured for performing a computation.

5. The system of claim 2, wherein the second crosswire array is configured for electron beam lithography.

6. The system of claim 2, wherein the second crosswire array is configured for image generation.

7. The system of claim 2, wherein the second crosswire array is configured for data storage and retrieval.

8. The system of claim 1, wherein one of the crosswire arrays is configured for pattern generation.

9. The system of claim 1, wherein one of the crosswire arrays is configured for performing a computation.

10. The system of claim 1, wherein one of the crosswire arrays is configured for image sensing.

11. The system of claim 1, wherein at least one of the first crosswire array and second crosswire array include nanowires.

12. The system of claim 1, wherein at least one of the first crosswire array and second crosswire array include nanotubes.

13. The system of claim 1, wherein the second substrate includes an aperture adjacent at least one of the first crosswire array or second crosswire array.

14. The system of claim 1, wherein the second substrate includes solid state circuitry to facilitate the electrical connection between the first output wiring to the second input wiring.

15. The system of claim 1, wherein the interconnection tips are nanowires, nanotubes, or carbon fibers.

16. The system of claim 1, wherein the interconnection tips are formed from a metallic or doped semiconductor material by an etching process.

17. The system of claim 1, further including scanning elements used to control positions of the crosswire arrays relative to the interconnection tips.

18. The system of claim 1, wherein the input wiring of the crosswire arrays is p-doped and the output wiring of the crosswire arrays is n-doped.

19. The system of claim 1, further including a third crosswire array and selection circuitry between the first, second, and third crosswire arrays.

20. A system comprising:
    a first crosswire array including first input wiring and first output wiring;
    a second crosswire array including second input wiring and second output wiring, wherein the first crosswire array and second crosswire array are provided on or above the same side of a first substrate; and
    a second substrate opposing the first substrate and including interconnection tips and circuit elements used to electrically connect the first crosswire array and the second crosswire array,
    wherein the first substrate is formed from a non-silicon material and the second substrate is formed from silicon.

* * * * *